United States Patent [19]

Aoki

[11] Patent Number: 5,008,166

[45] Date of Patent: Apr. 16, 1991

[54] METHOD FOR MANUFACTURING A COLOR FILTER

[75] Inventor: Toshihiro Aoki, Tokyo, Japan

[73] Assignee: Casio Computer Co., Ltd., Tokyo, Japan

[21] Appl. No.: 434,570

[22] Filed: Nov. 8, 1989

Related U.S. Application Data

[63] Continuation of Ser. No. 938,025, Dec. 4, 1986, abandoned.

[30] Foreign Application Priority Data

Dec. 9, 1985 [JP] Japan ............................ 60-276520

[51] Int. Cl.$^5$ .............................................. G03F 9/00
[52] U.S. Cl. .......................................... 430/7; 430/4; 430/5; 430/20; 430/26; 430/292; 430/293; 430/321; 430/327; 430/394; 430/396
[58] Field of Search ................. 430/4, 5, 7, 20, 26, 430/292, 293, 321, 324, 394, 396, 327

[56] References Cited

U.S. PATENT DOCUMENTS

| | | | |
|---|---|---|---|
| 3,317,320 | 5/1967 | Reber | 430/394 |
| 3,823,015 | 7/1974 | Fassett | 430/5 |
| 3,914,464 | 10/1975 | Thomasson et al. | 430/5 |
| 4,021,239 | 5/1977 | Ogawa | 430/394 |
| 4,311,773 | 1/1982 | Kaneko et al. | 430/7 |
| 4,339,514 | 7/1982 | Biber | 430/7 |
| 4,416,961 | 11/1983 | Drexhage | 430/7 |
| 4,673,253 | 6/1987 | Tanabe et al. | 350/339 F |

FOREIGN PATENT DOCUMENTS

| | | | |
|---|---|---|---|
| 23421 | 2/1981 | European Pat. Off. | 430/20 |
| 0035917 | 9/1981 | European Pat. Off. | |
| 0079111 | 5/1983 | European Pat. Off. | |
| 113237 | 7/1984 | European Pat. Off. | |
| 56-87322 | 7/1981 | Japan . | |
| 9639 | 1/1984 | Japan | 430/20 |
| 2111285 | 6/1983 | United Kingdom | 430/20 |

OTHER PUBLICATIONS

2244 Research Disclosure (1980), Jun., No. 194, Havant, Hampshire, Gt. Britain.
2320 Proceedings of the SID 24 (1983), No. 2, Los Angeles, Calif.. U.S.A., A Full–Color Matrix Liquid–Crystal Display With Color Layers On The Electrodes.

*Primary Examiner*—Charles L. Bowers, Jr.
*Assistant Examiner*—Thorl Chea
*Attorney, Agent, or Firm*—Frishauf, Holtz, Goodman & Woodward

[57] ABSTRACT

A method of manufacturing color filters in which a photosensitive film, which is used for forming filter elements, is formed on a substrate. A photomask with a given stripe pattern is placed above the photoresistive film. Under this condition, the photomasked-film is subjected to a first exposure process. The photomask is then moved in the direction of the stripes in the mask pattern. Following a second exposure process, developing, dyeing and dyeing-preventing processes are performed for color filter element formation. The foregoing steps are performed for each filter element for a specified color.

19 Claims, 8 Drawing Sheets

METHOD FOR MANUFACTURING A COLOR FILTER

This application is a continuation of application Ser. No. 07/938,025, filed Dec. 4, 1986 now abandoned.

BACKGROUND OF THE INVENTION

This invention relates to a method for manufacturing a color filter with an arrangement of filter elements of a plurality of colors for displaying a color image or for separating an image into a plurality of colors and providing image signals of these colors.

Recently, a color display device using a color filter in which filter elements of three primary colors, blue, green and red are arranged, has been put into practical use. In this device, the light rays coming through filter elements of these colors are synthesized for forming an image. A color image sensor has also been put into practical use. This device uses a color filter comprising filter elements of red, blue and yellow or filter elements of cyan, magenta and yellow and/or filter elements of black and white, and generates image signals of these colors.

In this type of the color filter, color filter elements are regularly arranged in a stripe fashion or a mosaic fashion, corresponding to the electrodes for display and photo detecting elements. Each filter element is extremely small. In the case of the stripe-type color filter, the width of each filter element is only about 0.1 mm or so. For this reason, photolithography is used for manufacturing the color filter, since this technique provides a minute pattern with high accuracy, and provides high productivity.

Figure 1A:
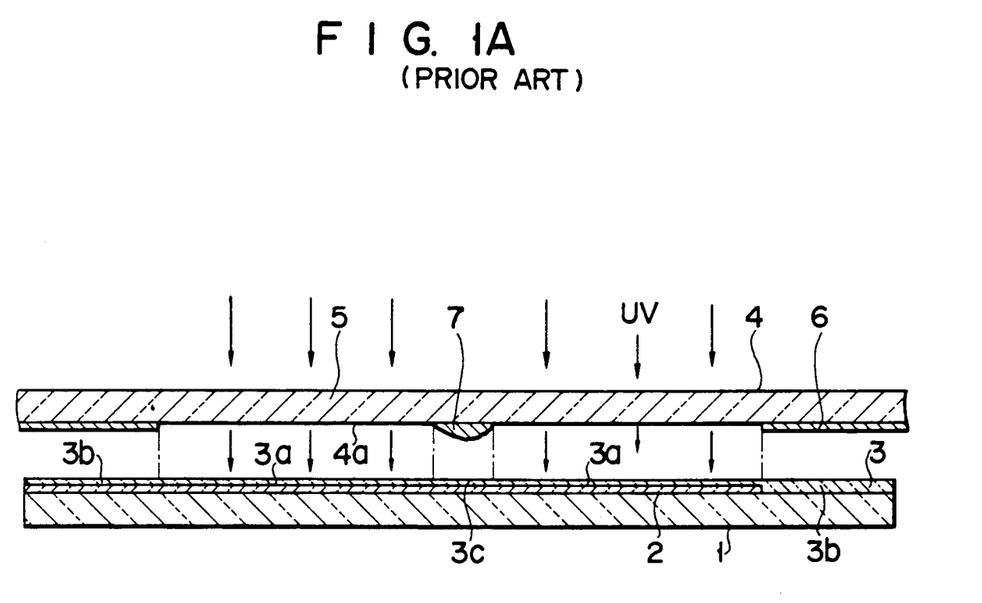
FIG. 1A and 1B show cross-sectional views for illustrating a conventional method of manufacturing color filters.
Figure 1B:
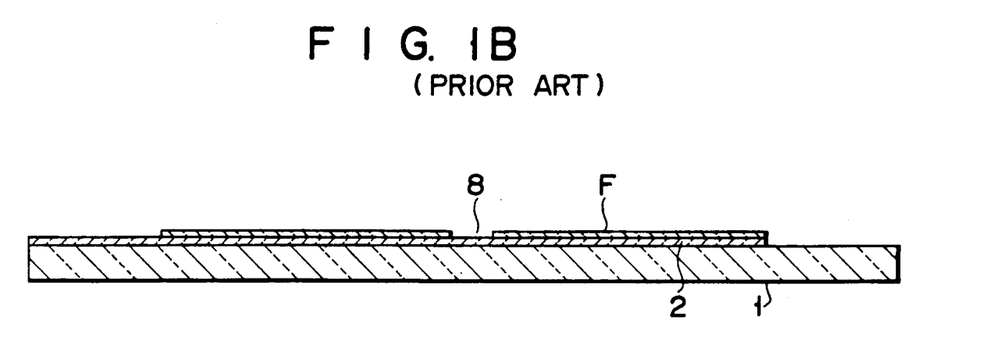

An example of a manufacturing process of the color filter by photolithography will be described with reference to FIGS. 1A and 1B. As shown in FIG. 1A, photosensitive film 3 is formed on glass substrate 1 on which electrodes 2 have already been made. Photo mask 4 is positioned above photosensitive film 3. Photo mask 4 comprises glass substrate 5 and opaque metal (made of, for example, chromium) layer 6 is formed on the portion of the surface of substrate 5, on which a filter is not to be formed. In the second step, photosensitive film 3 is irradiated by ultraviolet rays (UV) through photo mask 4, to expose the portion of the filter below the light transmitting portion 4a of photo mask 4. As a result of this radiation of ultraviolet rays, only portion 3a, which defines a shape of the filter element, is photochemically changed by an optical reaction. Then, in the developing process, the optically-unreacted portion, or unexposed portion 3b, is removed. In this way, the exposed portion 3a of photosensitive film 3 is formed on the electrodes 2 of glass substrate 1. This exposed portion is used as dyeable material layer F. By dyeing the dyeable material layer for each color, a color filter element of each desired color can be obtained.

In the conventional method of manufacturing a color filter as described above, if photo mask 4 is defective, or if dust is deposited on photo mask 4, the following problem arises. This problem will be described using a case where dust is deposited on the portion 4a of a desired filter pattern of photo mask 4. For this description, reference is made to FIGS. 1A and B. Portion 3c of photosensitive film 3 below dust 7, which is deposited on photo mask 4, is not radiated by ultraviolet rays in the ultraviolet rays-exposure step, since the rays are blocked by dust 7. This means that portion 3c is not optically reacted and is, therefore, removed in the developing process. As a result, this portion fails to become dyeable material layer F, forming a pinhole 8 in dyeable material layer F. Since pinhole 8 is located in the filter just above electrode 2, and at this pin hole portion, no light is absorbed by the filter element, pinhole 8 will appear as quite a bright white spot. In the color display device using such a color filter, because of the white spot, the quality of an image is extremely deteriorated. In the color image sensor using this type of color filter, color separation ability is degraded, and the image signal obtained has poor image reproducibility.

For the above reason, to manufacture such minute patterned filters, an environment is selected in which the size of dust particles in the air is limited to a certain value or less, and the number of these dust particles is also limited. To remarkably decrease the number of dust particles in the air, however, larger manufacturing facilities are required and the manufacturing cost is increased. Besides, it is almost impossible to eliminate dust altogether.

As for the mask manufacturing, the manufacture of defect-free masks leads to an increase in manufacturing costs and is actually almost impossible.

As described above, the conventional manufacturing method of a color filter has a serious disadvantage in that, due to defects of the photo mask and/or dust on the photo mask, numerous pinholes occur in the color filter.

SUMMARY OF THE INVENTION

An object of this invention is to provide a method for manufacturing a color filter which rarely suffers from defects such as pinholes and prevents an increase of the manufacturing costs.

To achieve the above object, there is provided a method for manufacturing a color filter comprising:

a first step for forming a film including a photosensitive material and a colorable material, on a substrate;

a second step for at least twice exposing said film while using a mask with a predetermined pattern, the exposure being performed at least once whenever the mask is placed at at least a first position and a second position distanced from said first position;

a third step for removing a portion of said exposed film corresponding to the unnecessary portions; and a fourth step following either one of said first and third steps, for coloring at least a part of said film.

The manufacturing method thus arranged has the following advantageous effects.

The irradiation is performed at least twice by moving the mask a predetermined distance at least once. Therefore, in both the cases, where either dust is deposited on the light transmitting portion of the mask, or the mask has a defect due to some remainder of light-shielding material on the mask, no pinhole is formed in the filter element. In other words, there is little probability that, after the mask is moved, dust and/or a defect is additionally deposited and/or appears in the same portion over the photosensitive film that is not irradiated with light rays before the mask is moved. Therefore, that portion of the film associated with the dust and/or defect must be subjected to at least one irradiation before or after the mask is moved, and is therefore chemically changed. This portion remains on the substrate even after it is subjected to the process step for removing the unnecessary portion of the film, so that a pinhole is never formed.

Thus, if a mask with some dust on it is used for the filter manufacturing, no defect occurs in the filter, and hence there is no need for keeping the manufacturing facilities and environment in a highly dust-free condition. Further, if a mask with some defect is used, the manufactured filter will have no defect. This eliminates the need for a perfect mask. Although the manufacturing method of this invention needs the additional step of an extra irradiation in association with moving the mask, the disadvantages of this additional step are negligible.

Therefore, according to this color filter manufacturing method, the color filter can be manufactured inexpensively and almost completely free from defects. In this respect, the manufacturing method of this invention is well-suited to the mass production of color filters.

DETAILED DESCRIPTION OF THE INVENTION

A manufacturing method of a color filter, of the type in which a plurality of color filter elements are regularly arranged in a predetermined sequence on a substrate by a photolithography process, will be described. The substrate member on which the color filter is formed is applicable to a glass substrate, a glass substrate on which display electrodes are formed, a substrate bearing photo sensing elements formed thereon, and the like.

A description of this invention, as applied to a color filter using a color liquid crystal display device, will be given below. This color filter employs red, green, and blue filter elements, which are arranged in that order to form a regular striped pattern. This color liquid crystal display device is constructed as shown in FIGS. 2, 3, and 4.

Figure 2:
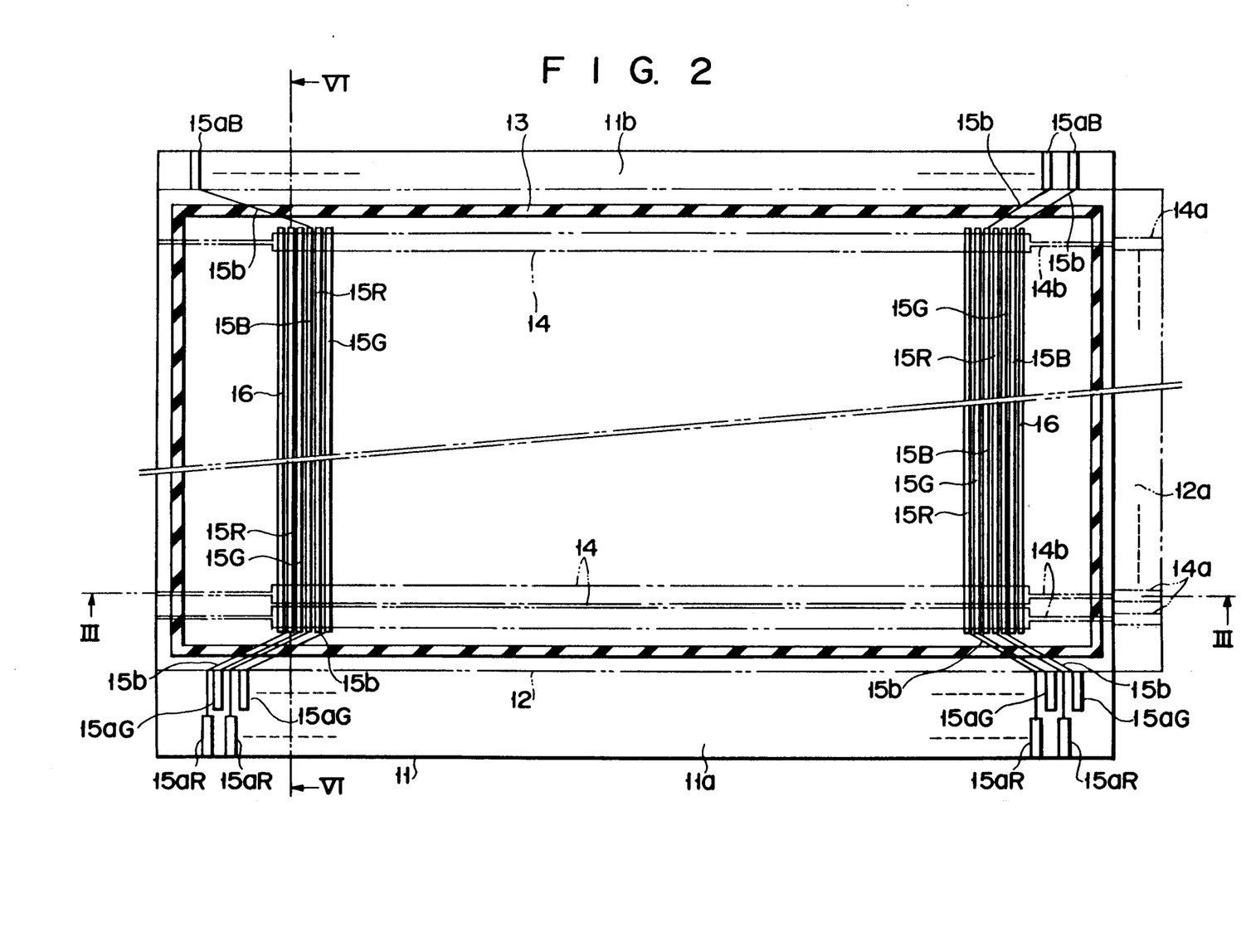
FIG. 2 shows a plan view of a color display device using a color filter as manufactured using a manufacturing method of color filters according to this invention.
Figure 3:
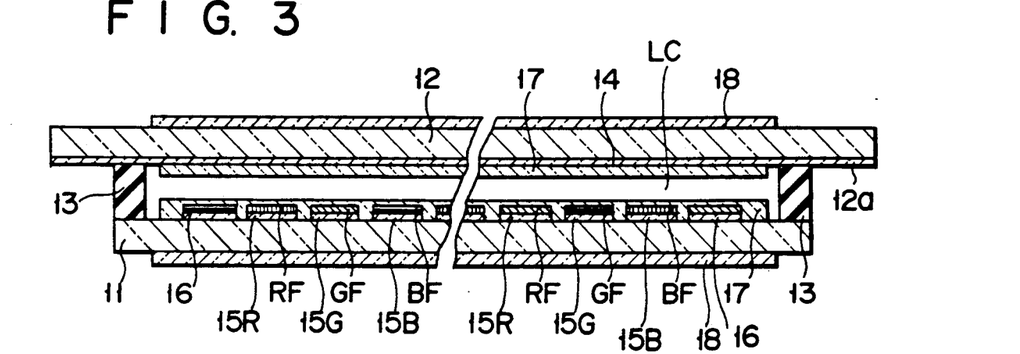
FIG. 3 shows a cross-sectional view taken along line III—III in FIG. 2.
Figure 4:
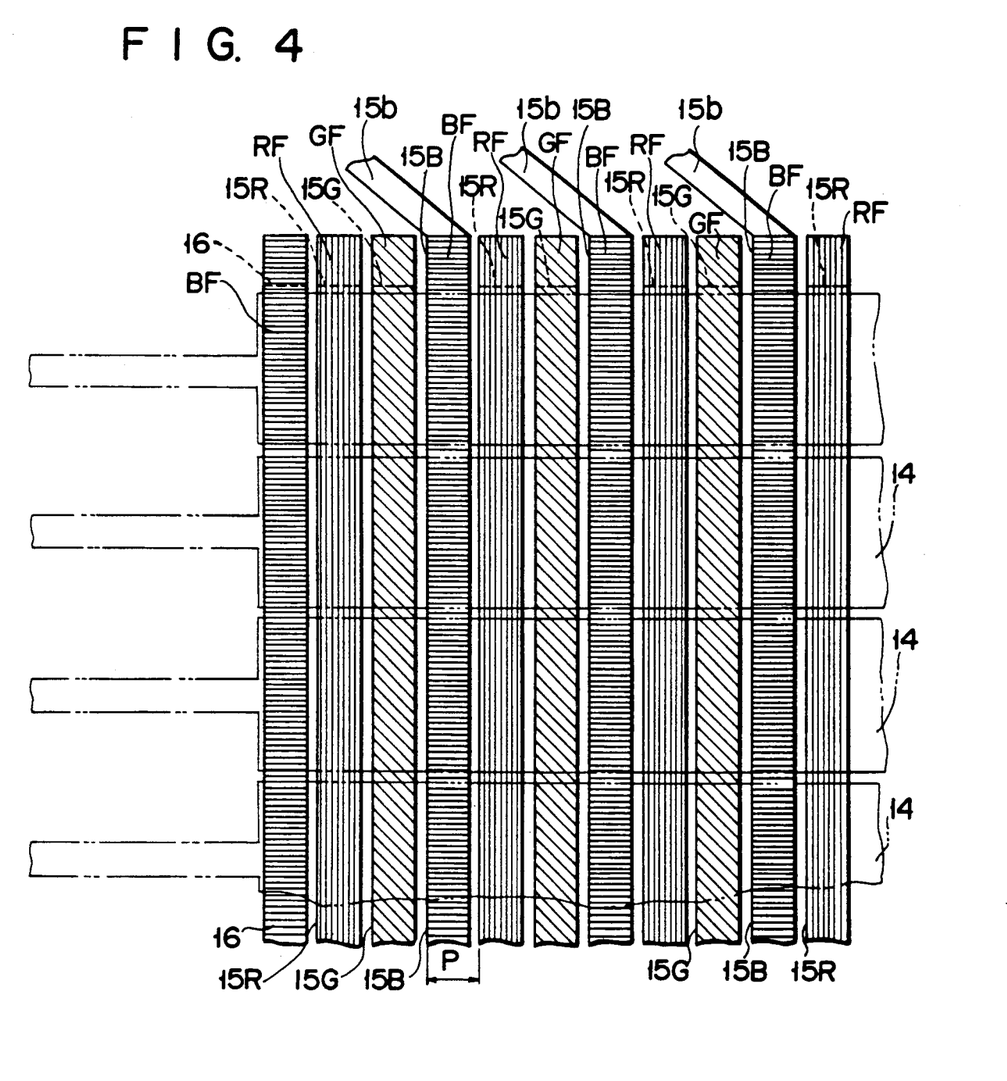
FIG. 4 shows an enlarged plan view of the color filter shown in FIG. 2.

In FIGS. 2 and 3, a pair of transparent substrates 11 and 12, made of glass plate, are bonded together at the frame-like sealing member 13, which is located around the edges of the substrates. A number of scanning electrodes (108, for example) are formed on the inner surface (bottom surface) of upper substrate 12. A number of transparent signal electrodes (450, for example) are formed on the inner surface (upper surface) of lower substrate 11, and those signal electrodes are arranged orthogonal to the formerly-mentioned scanning electrodes.

Transparent scanning electrodes 14 are aligned parallel to one another across the width of substrate 12. The ends of scanning electrodes 14 are respectively connected to drive circuit connection terminal 14a, through leads 14b. A plurality of drive circuit connection terminals are arranged along the terminal array portion 12a, which is formed by extending one edge of substrate 12 beyond sealing member 13. These drive circuit connection terminals 14a and leads 14b, which are integral with scanning electrodes 14, are constructed with transparent conductive members made of indium oxide, for example.

Transparent signal electrodes 15R, 15G, and 15B are formed on the inner surface of lower substrate 11, orthogonal to scanning electrodes 14. Each of these signal electrodes is made of indium oxide, etc., with a thickness of 50 to 60 nm. These signal electrodes are arranged consecutively in the order of 15R, 15G, and 15B to form a striped pattern.

In FIGS. 3 and 4, red, green, and blue filter elements RF, GF, and BF are arranged on signal electrodes 15R, 15G, and 15B, respectively. Red filter element RF, green filter element GF, and blue filter element BF are arranged consecutively, in that order, on signal electrodes 15R, 15G, and 15B, respectively.

In this manner, red filter element RF, green filter element GF, and blue filter element BF, as shown in FIG. 4, form a striped pattern which is repeated at fixed pitches P.

Each of these filter elements RF, GF, and BF has a thickness of 0.7 $\mu$m to 1.2 $\mu$m. Also, a liquid crystal aligning (orientation), film is formed on the front surface of each of these filter elements.

In FIG. 2, terminals 15aR are the drive circuit connection terminals for the signal electrodes 15R (hereinafter referred to as red signal electrodes) on which the red filter elements RF are formed. Terminals 15aG are the drive circuit connection terminals for signal electrodes 15G (hereinafter referred to as green signal electrodes) on which the green filter elements GF are formed. Terminals 15aB are the drive circuit connection terminals for signal electrodes 15B (hereinafter referred to as blue signal electrodes) on which the blue filter element is formed. Signal electrodes 15R, 15G and 15B are connected to terminals 15aR, 15aG and 15aB respectively, by leads 15b.

Terminals 15aR of red signal electrodes 15R are arranged in a line along the edge of terminal array portion 11a, which is one of the two terminal array portions (11a and 11b) extending outside sealing members 13 of lower substrate 11. Terminals 15aG of green signal electrodes 15 are located in a line inside the row of terminals for red signal electrodes 15R on terminal array portion 11a. Terminals 15aB of blue display electrodes 15B are arranged in a line on the other terminal array portion 11b.

These terminals 15aR, 15aG and 15aB, and leads 15b, which are formed integral with signal electrodes 15R, 15G and 15B, respectively, are made of indium oxide transparent conductive material.

Electrodes 16 which are not used, and have a length equal to those of signal electrodes are located on the outside of the outermost signal electrodes 15R and 15B. These unused electrodes 16 are formed by indium oxide conductive material simultaneously with the signal electrodes. Since these electrodes 16 are unused, they are not connected to the drive circuit.

These unused electrodes 16 are provided on the outside of outermost signal electrodes 15R and 15B so that, after the transparent conductive material is deposited on substrate 11 by the sputtering process, when signal electrodes 15R, 15G and 15B are formed by etching, the signal electrodes will be prevented from being too narrow.

In FIG. 3, liquid crystal aligning films 17 are provided on the inner surfaces (electrode array surfaces) of upper substrate 12 and lower substrate 11. Polarizing plates are provided on the outer surfaces of upper substrate 12 and lower substrate 11. Liquid crystal aligning films 17 are formed by applying a rubbing treatment to the surfaces of polyimide films. Each direction of rubbing of the films 17 are perpendicular to each other. The liquid crystal material LC, which is filled between substrates 11 and 12, is twisted 90°, by liquid crystal aligning film 17, such that the molecules at the upper region of the material are arranged perpendicularly to the molecules at the lower region of the material. Polarizing plates 18 are arranged so that their polarization axes are aligned with the aligning direction of the liquid crystal molecules (the rubbing direction of the aligning film) of either of the substrate surfaces. With this arrangement, a negative display type liquid crystal display element is formed.

To operate the color liquid crystal display element thus constructed, a voltage is applied between signal electrodes 15R, 15G, and 15B and scanning electrodes 14, which are arrayed facing the signal electrodes, in accordance with a video signal. The liquid crystal LC at the point where the selected electrodes and the common electrodes intersect, is activated. An intensity of the light transmitted by color filter elements RF, GF and BF of signal electrodes 15R, 15G and 15G is controlled by the action of liquid crystal substance LC, to provide color display.

Next, a manufacturing method of color filters according to this invention, which is used in manufacturing color liquid crystal display device, will be described with reference to FIGS. 5A to 5F, 6A to 6C, and 7.

Figure 5A:
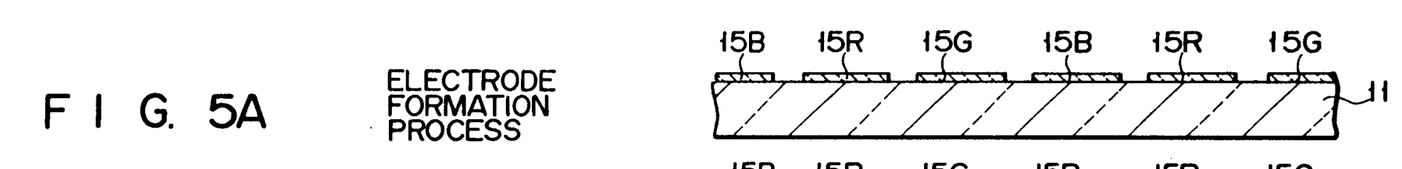
FIGS. 5A to 5F show a series of cross sectional views taken along line IV—IV in FIG. 2, which illustrate steps of manufacturing a color filter according to this invention.
Figures 5B, 5C:
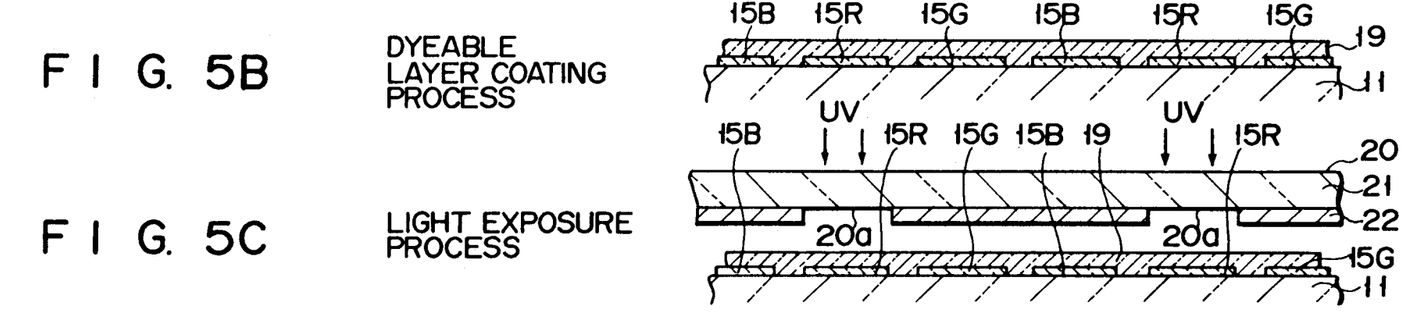

The red color filter elements RF, to be provided on signal electrodes 15R, are formed after the process steps shown in FIGS. 5A to 5F and 6A to 6C are performed. First, the lower substrate 11 with signal electrodes 15R, 15G and 15B arranged on it, is prepared (FIG. 5A) with conventional method. Then, the dyeable layer 19, which comprises a mixture of a filtering material composed of a protein substance such as casein or glue, and a photosensitive material such as ammonium dichromate, is applied to the entire surface of lower substrate 11, so as to cover all the signal electrodes (FIG. 5B). Next, light exposure is performed by irradiating ultraviolet rays on the portion of dyeable layer 19, which is located on red signal electrodes 15R, using photomask 20 (FIG. 5C).

This exposure process is shown in detail in FIGS. 6A to 6C and FIG. 7. In photo mask 20, chrome plating 22 is applied to the surface of glass plate 21, except in the predetermined areas of ultraviolet rays transmitting portion 20a. This chrome-plated portion 20b prevents ultraviolet rays UV from being transmitted therethrough. The light transmitting portions 20a of photomask 20 are arranged at pitches each three times the pitch P (FIGS. 4 and 7) of stripe signal electrodes 13, to match the shape of the filter element of the same color (for example, red filter elements RF) of those filter elements RF, GF and BF.

Figure 6A:
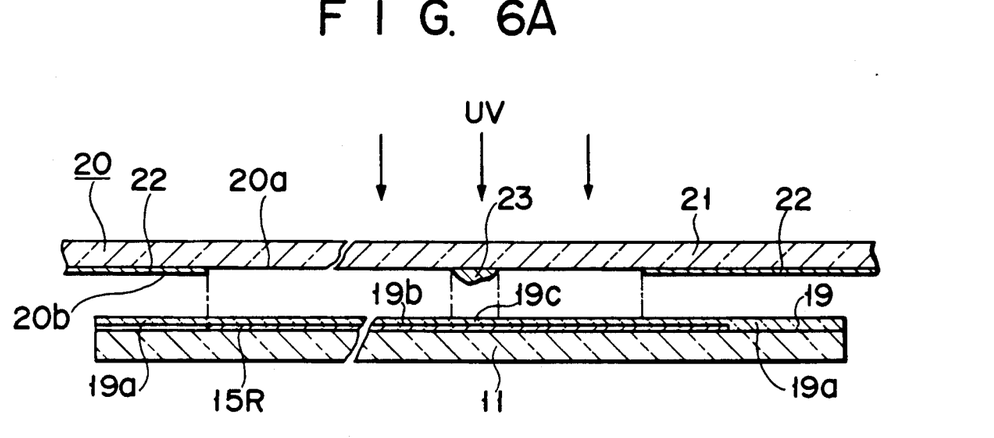
FIGS. 6A to 6C show cross-sectional views taken on line VI—VI in FIG. 2, which illustrates in detail the exposure steps in FIGS. 5A to 5F.
Figure 6B:
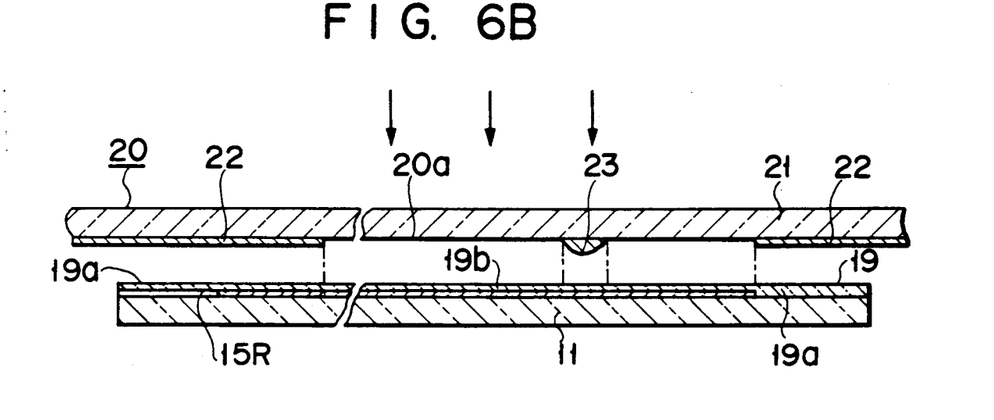
Figure 7:
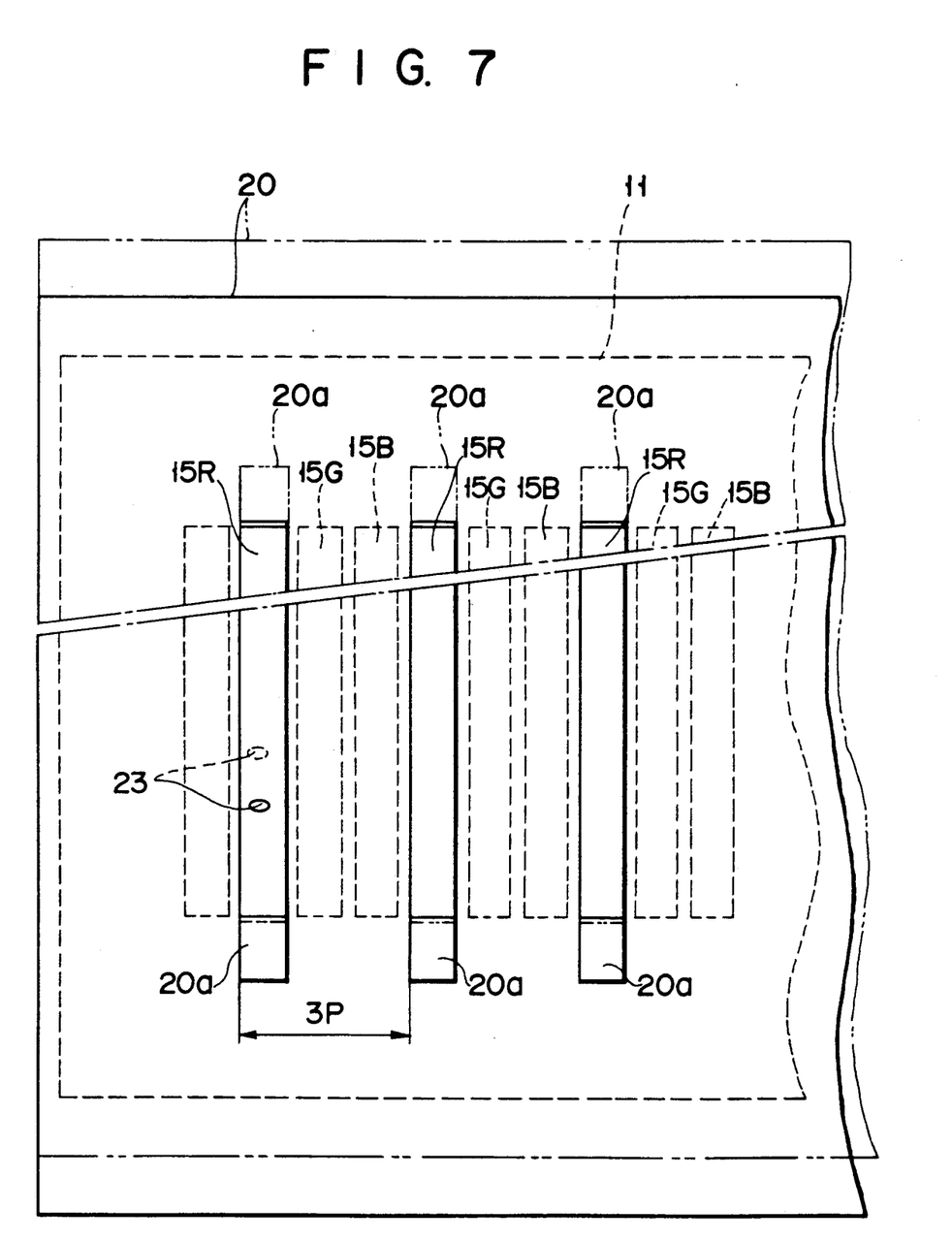
FIG. 7 shows a plan view partially illustrating the color display device, which is for illustrating the movement direction of the mask shown in FIG. 4.

Photomask 20 is located so that light transmitting portions 20a coincide with red signal electrodes 15R, as indicated by the solid lines in FIGS. 6a and 7. In this condition, ultraviolet rays are irradiated from above photomask 20, and layer 19 is subjected to the first exposure. Next, photomask 20 is moved in the longitudinal direction of red signal electrodes 15R (the direction of the stripes) to the position indicated by the two-dots-chain lines of FIG. 7. Then, ultraviolet rays are irradiated from above photomask 20, and dyeable layer 19 is subjected to the second exposure. The distance over which photomask 20 is moved is set to a value larger than any dust that is expected to adhere to photomask 20. That is to say, if the color filters are manufactured in an environment in which particles of dust larger than 100 μm in diameter do not exist, photomask 20 may be moved a minimum of 100 μm.

Figures 5D, 5E:
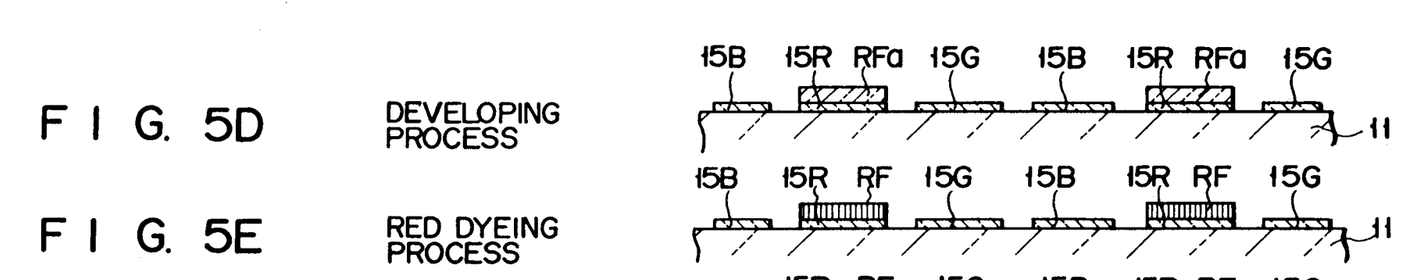
Figure 5F:
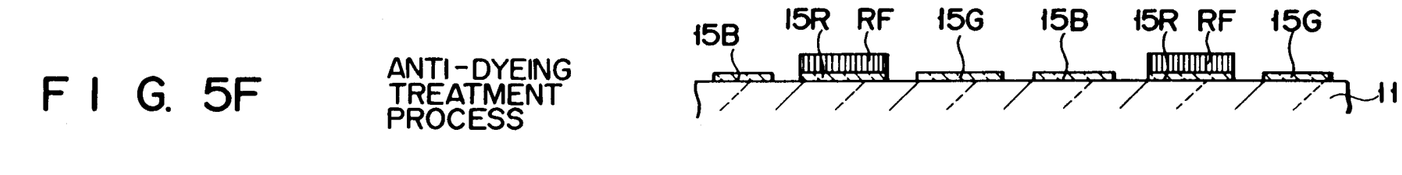
Figure 6C:
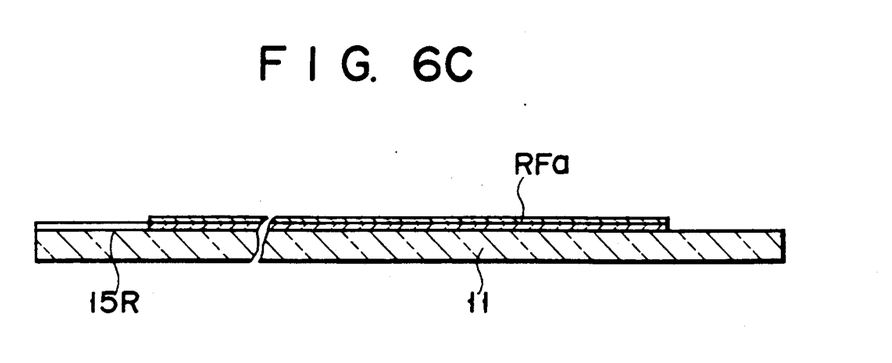

After the exposure process, the unexposed portion 19a of dyeable layer 19, which has not been exposed to ultraviolet rays, and has had no chemical reaction, is removed from substrate 11 by the developing process. Exposed portion 19b of dyeable layer material 19, which has been exposed to ultraviolet rays and chemically changed by a chemical reaction, is left on red signal electrodes 15R. In this manner, dyeable layers RFa are formed on the surface of red signal electrodes 15R (FIGS. 5D and 6C). These dyeable layers RFa are then dyed with red dye (FIG. 5E). By applying an anti-dyeing treatment with tannic acid to these dyed red filter elements RF, red filter elements RF are formed.

Green filter elements GF and blue filter elements BF are formed on green signal electrodes 15G and blue signal electrodes 15B, by using the process steps similar to those for the red filter elements. In this case, for the first and second exposures for the dyeable layer corresponding to green filter element GF, the initial position of photo mask 20 for the first exposure is set to the position distanced by one pitch (P) of the stripes from the position when the red filter element RF is formed, in the direction perpendicular to the stripes. For the first and second exposures for the dyeable layer corresponding to blue filter element BF, the initial position of photo mask 20 for the first exposure is set to the position distanced by two pitches (2P) of the stripes from the position when the red filter element RF is formed, in the direction perpendicular to the stripes.

If a defect, such as residual chrome of the photomask or dust deposits, exists in light transmitting portion 20a of photomask 20, unexposed portion 19c is formed on dyeable layer 19 pertaining to the above defect in the first exposure. However, in the second exposure after photomask 20 has been moved, unexposed portion 19c is irradiated by ultraviolet rays, and unexposed portion 19c is chemically changed due to the chemical reaction. Since unexposed portion 19c is not removed by the subsequent developing process, a color filter element without pinholes is obtained.

The reason why the pinhole-free filter element can be obtained is that there is little probability that after the mask is moved, another defect of photo mask will be located over the unexposed portion 19c which, in the first exposure, had not been irradiated with rays. For this reason, dyeable layer 19 pertaining to the defect on photomask 20 will be irradiated with light at least once during the first and second exposures, and defects on photomask 20 will not appear in dyeable layer 19.

Also, in order to further reduce the probability of the occurrence of pinholes, after the second exposure, photomask 20 can be moved again in the direction of the stripes, and then a third exposure can be performed. Since the probability of different defects existing at exactly the same position is very slight, the probability of pinholes occurring is greatly reduced.

In the color filter thus formed, both ends of each color filter element include portions which have been irradiated once by ultraviolet rays and the center portion, between these portions, has been irradiated twice. It is desirable that the portions that have been irradiated once are outside the display area.

Figure 8:
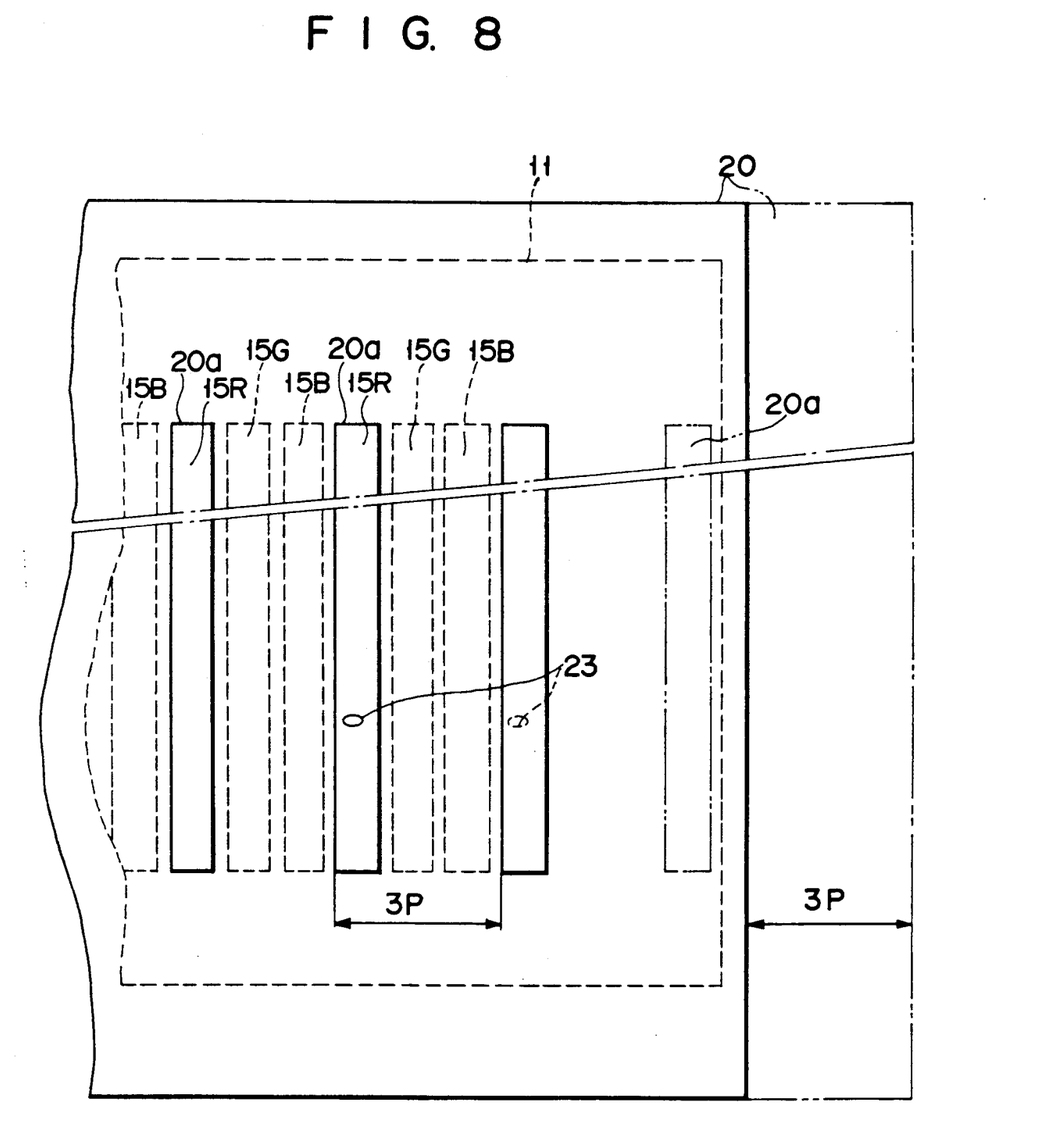
FIG. 8 shows a plan view partially illustrating the color display device, which is for illustrating the movement direction of the mask different from that of FIG. 7 and according to another manufacturing method of color filters of this invention.

FIG. 8 shows a modification of a manufacturing method of color filters according to this invention. In this modification, during the first exposure, photomask 20 is positioned in the position as indicated by the solid line in FIG. 8, for light irradiation. Then, as shown by the two-dot-chain lines in FIG. 8, photomask 20 is moved by three pitches (3P) in the direction orthogonal to the the stripes, and the second exposure is performed.

When the filter elements are formed in this way, the probability of defects existing at the exactly same point over dyeable layer 19 in both the first and second exposure is very slight, and the probability of the occurrence of pinholes is reduced.

As explained above, according to the above embodiment, photomask 20 is either moved from first to second positions in the direction in which signal electrodes 15 extend, or in a direction perpendicular to that. Ultraviolet rays are irradiated on the photosensitive dyeable layer 19 at least one time when photomask 20 is located at first position, and at least one time when photomask 20 is located at second position. Therefore, without complicating the manufacturing process, the dyeable layer of the filters can be formed easily, and the occurrence of pinholes in color filter elements RF, GF and BF can be minimized. The portions of the dyeable layer that have been irradiated with ultraviolet rays only once are outside the display area. With such an arrangement, a color liquid crystal display element with a defect-free color filter can be obtained.

Figure 9A:
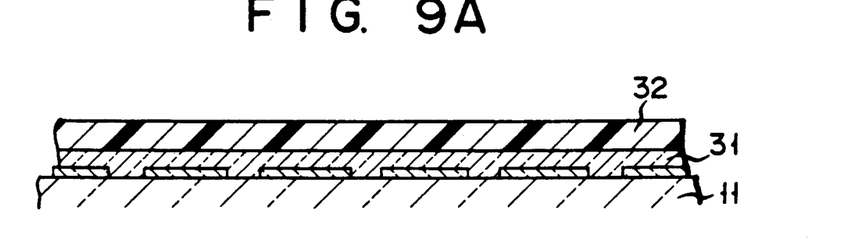
FIGS. 9A to 9C show a series of cross-sectional views which illustrate steps of manufacturing a color filter according to another embodiment of this invention.
Figure 9B:
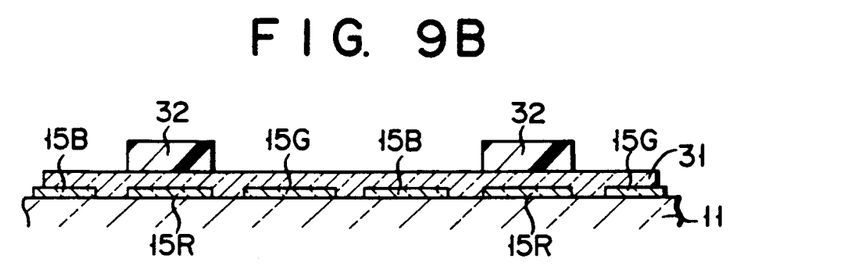
Figure 9C:
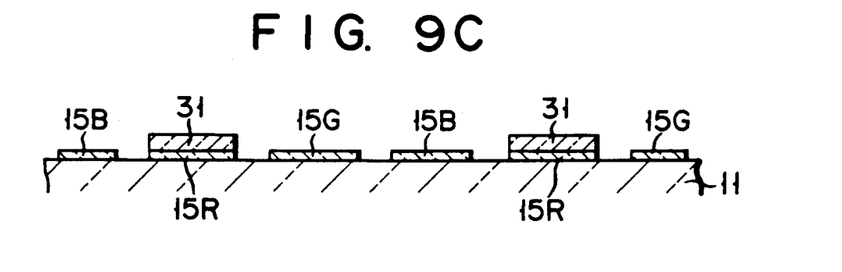

While, in the above-mentioned embodiment, an albuminous material with photosensitivity is used for dyeable layer 19, but synthetic resin with photosensitivity may be used for the dyeable layer. Further, the process for forming filter elements is not limited to that of the above embodiment. For example, in the coating process of the dyeable layer, filter material and the photosensitive material, i.e. photoresist, may be layered doubly. Such an embodiment will be explained with reference to FIGS. 9A-9C. First, substrate 11, on which signal electrodes 15 are formed in the manner shown in FIG. 5A, is prepared. Next, dyeable layer 31, used for forming filter elements, is formed on substrate 11. Layer 32 of a photosensitive material, e.g., a photoresist layer, is formed on dyeable layer 31, as shown in FIG. 9A. As shown in FIG. 9B, photoresist layer 32 is exposed to light and developed such that it remains only in the region where formation of the filter elements is desired. Layer 31 is then etched, using the remaining photoresist layer 32 as an etching resist. By this etching step, layer 31 remains only on predetermined electrodes. Thereafter, the remaining portions of photoresist layer 32 are removed, as shown in FIG. 9C. The remaining portions of layer 31 are dyed, as in the process shown in FIGS. 5E and 5F. Thereafter, an anti-dyeing treatment is applied. The above steps are repeated for each color. According to the process of this embodiment, when photoresist 32 is exposed to light, the photomask is moved at least once. Due to this, it is possible to prevent the occurrence of defects such as pinholes.

The color filter manufacturing method is not limited to color filter elements arranged in the stripe pattern as described above. The same method may also be applied for those arranged in a mosaic or matrix pattern.

Figure 10:
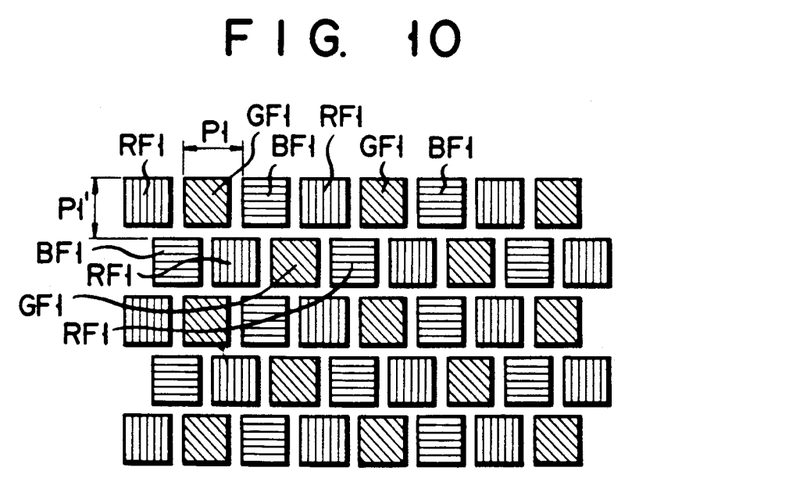
FIG. 10 shows a plan view illustrating another array of color filters for which the manufacturing method of color filters according to this invention is applicable.

Such an instance is illustrated in FIG. 10. As shown, red filter element RF1, green filter element GF1 and blue filter element BF1 are formed like small square dots, and arranged in this order to form a trio of filter elements. These trios are arranged contiguously to form a color filter. In this case, during the first and second exposures, the photomask is moved horizontally on the drawing for a distance of three horizontal pitches (P1×3) of the horizontal array of the color filter elements. When the photomask is moved both vertically and horizontally on the drawing, it is moved horizontally by 1×½pitches (P1×1½) horizontally, and vertically for one pitch (P1') of the vertical array of color filter elements.

In the above-mentioned embodiments, the photo mask is moved a predetermined distance in the stripe-extending direction, and a distance three times the pitch in the direction of the horizontal array of the filter elements. In the case of the mosaic pattern filter, it is moved so that the filter element patterns are overlapped. As an alternative, it may be moved in the stripe-extending direction and across the stripe pattern. Additionally, it may be moved a distance three times the pitch of the vertical array of filter elements, across the stripe pattern. Essentially, the photomask may be moved in any way, if some of the corresponding filter elements are overlapped for exposure.

In the above-mentioned embodiments, after the filter elements are formed, these elements are dyed. Alternatively, after the dyeable film is formed, it is dyed, and subjected to the exposure process and the etching process.

While the above embodiments relate to the forming of color filter film for the color liquid crystal display element, this invention may also be applied to the forming of color filter film for other elements, such as color image sensors.

What is claimed is:

1. A method of manufacturing a color filter having color filter elements of the three primary colors which are arranged in a pattern employed in a liquid crystal display device, comprising the steps of:
   a first step of forming a negative photosensitive and colorable one-layer film on at least one of a pair of substrates employed in the liquid crystal color display device and facing each other;

a second step including a first sub-step of positioning a mask having a predetermined pattern at a first position relative to said film and exposing said film at least one time, and a second sub-step of positioning said mask, substantially sequentially after said first sub-step, at a second position away from said first position and exposing said film at least one time;

a third step of removing portions of the film which are not exposed when said mask is in both of said first and said second positions in the second step, whereby preventing said portions from forming said color filter elements; and a fourth step following either one of said first and said third steps, for coloring at least a part of said film in one of the three primary colors.

2. The method according to claim 1, wherein: said first step includes forming said film from a photosensitive dyeable resin or a mixture of protein and photosensitive material.

3. The manufacturing method according to claim 1, wherein said first step includes forming said substrate as a transparent substrate, positioning transparent electrodes, arranged in a stripe fashion on said substrate and forming said film on said substrate and said electrodes.

4. The manufacturing method according to claim 3 wherein said second sub-step includes a step in which said mask is moved in the stripe-extending direction of said electrodes and placed at the second position, and said film is irradiated by light rays through said mask.

5. The manufacturing method according to claim 3, wherein said second sub-step includes a step in which said mask is moved in a direction orthogonal to the strip-extending direction of said electrodes and placed at the second position, and said film is irradiated by light rays through said mask.

6. The manufacturing method according to claim 5, wherein said mask is moved from first position to second position by a distance which is a pitch of said stripe-patterned electrode for a specified color.

7. The manufacturing method according to claim 1, including forming segmented electrodes into small unit sections on said substrate, and arranging electrodes corresponding to each color on the substrate in a zigzag fashion, and said first step includes forming the photosensitive film on said substrate and on said electrodes, said first sub-step of said second step includes placing said mask with a pattern analogous to the pattern of said electrodes formed on the substrate at the first position which is set corresponding to said electrodes, and said film is irradiated by light rays through said mask, and said second sub-step includes placing said mask at the second position by a distance corresponding to the pattern of said color filter elements, and said film is irradiated by light rays though said mask.

8. The manufacturing method according to claim 1, wherein said fourth step includes dyeing a portion of the film left on a surface of the substrate using a desired dyeing material.

9. The method according to claim 1, including providing said film with photosensitivity so as to be hardened by irradiation of light, and said third step comprises removing unhardened portions of said film.

10. A method of manufacturing a color filter having color filter elements of the three primary colors which are consecutively arranged in a pattern employed in a liquid crystal color display device, comprising the steps of:

a step in which a negative photosensitive dyeable one-layer film is formed on at least one of a pair of substrates employed in the liquid crystal color display device and facing each other, with a plurality of electrodes pertaining to the three primary colors being arranged in a stripe fashion on the at least one of a pair of substrates;

a first exposing step in which a mask with a light-transmitting portion with a stripe pattern corresponding to the stripe pattern of electrodes is placed at a first position which is set corresponding to said electrodes, and said film is irradiated by light rays through the mask;

a second exposing step in which said mask is moved by a predetermined distance and placed at a second position, and said film is irradiated by light rays through the mask, said second exposing step being executed substantially sequentially after said first exposing step;

a developing step in which the portion of said film not exposed to light rays is removed by dissolving it, said developing step being executed substantially sequentially after said second exposing step;

a dyeing step in which the film remaining on the electrodes of the substrate is dyed by a desired dyeing material, to form color filter elements of the three primary colors.

11. The method according to claim 10, wherein said second exposing step includes a step of moving said mask in the stripe-extending direction of said electrodes by a predetermined distance, and said film irradiated by light rays through the mask.

12. The method according to claim 10, wherein said step of forming said dyeable material film includes a step for forming a dyeable film on a substrate which has three types of electrodes pertaining to red, green and blue, consecutively arranged in a stripe fashion, said second exposing step includes a step for moving said mask by three pitches of the stripe pattern of three types of electrodes, and a step for irradiating said film with light rays through the mask.

13. A method of manufacturing a color filter having color filter elements of the three primary colors which are consecutively arranged in a pattern employed in a liquid crystal color display device, comprising the steps of:

a first step of forming on at least one of a pair of substrates employed in the liquid crystal display device and facing each other a film with a photosensitivity so as to be hardened by irradiation of light, said film having colorability;

a second step including a first sub-step of positioning a mask having a predetermined pattern at a first position relative to said film and exposing said film at least one time, and a second sub-step of positioning said mask substantially sequentially after said first sub-step, at a second position away from said first position and exposing said film at least one time;

a third step of removing portions of the film which are not exposed when said mask is in both of said first and said second positions in said second step, said third step being extended only once, after said first and second sub-step of said second step are completed; and a fourth step following either one of said first and said third steps, for coloring at least a part of said film in one of the three primary colors.

14. The method of claim 13, wherein said first step includes forming said film from a photosensitive dyeable resin or a mixture of protein and photosensitive material.

15. The method of claim 13, wherein said first step includes forming said substrate as a transparent substrate, positioning transparent electrodes arranged in a stripe fashion on said substrate, and forming said film on said substrate and said electrodes.

16. The method of claim 13, including forming stripe-patterned electrodes on said substrate and forming said film on the surface of the substrate and said electrodes, the first sub-step of said second step includes setting said first position of the mask to correspond with said electrode pattern and irradiating said film by light rays through said mask, and the second sub-step includes setting said second position of the mask a certain distance away from said first position and irradiating the film by light rays through said mask.

17. The method of claim 16, wherein said second sub-step includes moving said mask in the direction of the stripes of said electrodes when setting the mask at the second position.

18. The method of claim 16, wherein said second sub-step includes moving said mask in a direction orthogonal to the direction of the stripes of said electrodes when setting the mask at said second position.

19. The method of claim 13, wherein said fourth step includes dyeing a position of the film left on a surface of the substrate using a desired dyeing material.

* * * * *